(12) United States Patent
Takahashi

(10) Patent No.: US 7,916,486 B2
(45) Date of Patent: Mar. 29, 2011

(54) CIRCUIT BOARD, CONNECTION STRUCTURE, AND APPARATUS

(75) Inventor: Kozo Takahashi, Tokyo (JP)

(73) Assignee: Sharp Kabushiki Kaisha, Osaka (JP)

( * ) Notice: Subject to any disclaimer, the term of this patent is extended or adjusted under 35 U.S.C. 154(b) by 919 days.

(21) Appl. No.: 11/720,120

(22) PCT Filed: Aug. 31, 2005

(86) PCT No.: PCT/JP2005/015841
§ 371 (c)(1),
(2), (4) Date: May 24, 2007

(87) PCT Pub. No.: WO2006/059412
PCT Pub. Date: Jun. 8, 2006

(65) Prior Publication Data
US 2009/0016030 A1    Jan. 15, 2009

(30) Foreign Application Priority Data

Nov. 30, 2004 (JP) ................................. 2004-347387

(51) Int. Cl.
*H05K 5/20* (2006.01)
(52) U.S. Cl. ........................................ 361/720; 439/951
(58) Field of Classification Search .................. 361/760, 361/720, 748, 736; 439/148, 951
See application file for complete search history.

(56) References Cited

U.S. PATENT DOCUMENTS

| 5,322,447 | A | * | 6/1994 | Okada | ............................. | 439/79 |
| 5,419,708 | A | * | 5/1995 | Koss et al. | ...................... | 439/59 |
| 6,027,366 | A | | 2/2000 | Mori et al. | | |
| 6,674,644 | B2 | * | 1/2004 | Schulz | ........................... | 361/728 |
| 7,044,773 | B2 | | 5/2006 | Suzuki et al. | | |
| 7,172,465 | B2 | * | 2/2007 | Kinsley | ......................... | 439/637 |
| 7,399,192 | B2 | * | 7/2008 | Yamamoto | .................... | 439/260 |
| 2004/0023551 | A1 | | 2/2004 | Suzuki et al. | | |
| 2006/0110974 | A1 | | 5/2006 | Suzuki et al. | | |
| 2006/0205257 | A1 | | 9/2006 | Suzuki et al. | | |
| 2007/0087591 | A1 | | 4/2007 | Suzuki et al. | | |
| 2007/0087605 | A1 | | 4/2007 | Suzuki et al. | | |

FOREIGN PATENT DOCUMENTS

| JP | 06-232523 A | 8/1994 |
| JP | 07-038290 A | 2/1995 |
| JP | 07-288371 A | 10/1995 |
| JP | 2002-157920 A | 5/2002 |
| JP | 2004-178959 A | 6/2004 |

OTHER PUBLICATIONS

International Search Report issued in corresponding International Application No. PCT/JP2005/015841; mailed on Nov. 15, 2005.

* cited by examiner

*Primary Examiner* — Hung S Bui
(74) *Attorney, Agent, or Firm* — Keating & Bennett, LLP

(57) ABSTRACT

A circuit board is connected to a connector including a connection port and contact portions located at upper and lower positions of the connection port. The contact portions face each other in the vertical direction, and each contact portion is connected electrically to the opposite contact portion. The circuit board includes a base substrate, a first wiring layer, and a second wiring layer. First terminals connected to the first wiring layer are provided on one principal surface of the base substrate, and second terminals connected to the second wiring layer are provided on the other principal surface. The first terminals and the second terminals come into contact with the contact portions and are arranged so as not to overlap each other in the vertical direction.

9 Claims, 6 Drawing Sheets

CIRCUIT BOARD, CONNECTION STRUCTURE, AND APPARATUS

BACKGROUND OF THE INVENTION

1. Field of the Invention

The present invention relates to a circuit board, particularly a flexible printed circuit board, a connection structure using the circuit board, and an apparatus having the connection structure.

2. Description of the Related Art

Unlike a rigid board, a flexible printed circuit (FPC) board can be bent or folded, and therefore is distinctive in its high degree of freedom in arrangement. Thus, the FPC board is useful for an apparatus that has a small space available for wiring arrangement such as a flat panel display typified by a liquid crystal display panel.

One end of the FPC board is connected to a connector provided in an external circuit board or the like. See, e.g., JP 2004-178959 A (FIGS. 1 to 4) (Patent Document 1) and JP 7 (1995)-288371 A (FIGS. 1, 3, 9, 13 and 19) (Patent Document 2). Moreover, due to the recent development in mounting technology, electronic components can be mounted on the FPC board. This can make the apparatus thinner or lighter. Hereinafter, a conventional connection structure of the FPC board and the connector will be described with reference to the drawings.

FIGS. 5A and 5B are cross-sectional views showing an example of a FPC board and a connection structure in a conventional technique. FIG. 5A is a cross-sectional view of the connection structure. FIG. 5B is a cross-sectional view of the FPC board taken along the line B-B' in FIG. 5A. In FIGS. 5A and 5B, the cross section of a conductive member is not hatched, and electronic components are shown only in outline.

As shown in FIG. 5A, a FPC board 30 is connected to a connector 40, thereby forming a connection structure. In FIGS. 5A and 5B, the FPC board 30 includes a base substrate 31 with flexibility, a signal wiring layer 32a provided on one surface of the base substrate 31, and a signal wiring layer 32b provided on the other surface of the base substrate 31. The signal wiring layers 32a, 32b have signal conductors, respectively.

Electronic components 39a are mounted on one surface of the FPC board 30. Moreover, to improve the packaging density, electronic components 39b also are mounted on the other surface of the FPC board 30. In the example of FIGS. 5A and 5B, the electronic components 39a, 39b are bump-mounted. Specifically, each of the electronic components 39a is connected electrically to the signal wiring layer 32a via bumps 37a and electrodes 36a provided on the signal wiring layer 32a. Each of the electronic components 39b is connected electrically to the signal wiring layer 32b via bumps 37b and electrodes 36b provided on the signal wiring layer 32b.

The signal wiring layer 32a is covered with a protective film 34, and the signal wiring layer 32b is covered with a protective film 35. The protective films 34, 35 are made of a resin material. However, part of the signal conductors of the signal wiring layer 32a is not covered with the protective film 34, but exposed. There are a plurality of exposed portions 38, and they serve as terminals in the form of stripes.

Some of the signal conductors that are exposed partially from the protective film 34 are connected to the signal conductors of the signal wiring layer 32b via through holes 33 provided in the base substrate 31. Thus, in the FPC board 30, the through holes 33 are used to improve the packaging density by mounting the electronic components on both surfaces, while the terminals are concentrated on one surface.

The connector 40 is generally called a dual contact connector and includes a terminal member 41 and a housing 44 made of resin. The terminal member 41 has a U-shaped portion to fasten the FPC board 30 in the vertical direction. One end of the U-shaped portion of the terminal member 41 is a contact portion 42 that comes into contact with the upper surface of the FPC board 30, and the other end of the U-shaped portion is a contact portion 43 that comes into contact with the lower surface of the FPC board 30.

Accordingly, the connector 40 includes two upper and lower contact portions 42, 43, and thus can be used not only as an upper contact type connector, but also as a lower contact type connector. In the example of FIG. 5, the electric connection between the FPC board 30 and the connector 40 is made by connecting the upper contact portion 42 to the portion 38 (terminal) exposed from the protective film 34.

In another example of a connection structure using a FPC board, the FPC board is provided with a shielding layer to suppress the generation of noise due to the FPC board. This example will be described by referring to FIG. 6.

FIGS. 6A and 6B are cross-sectional views showing another example of a FPC board and a connection structure in a conventional technique. FIG. 6A is a cross-sectional view of the connection structure. FIG. 6B is a cross-sectional view of the FPC board taken along the line C-C' in FIG. 6A. In FIGS. 6A and 6B, the cross section of a conductive member is not hatched, and electronic components are shown only in outline.

As shown in FIG. 6A, a FPC board 50 is connected to a connector 61, thereby forming a connection structure. However, as shown in FIGS. 6A and 6B, the FPC board 50 includes a base substrate 51 with flexibility, a signal wiring layer 52 provided on one surface of the base substrate 51, and a shielding layer 53 provided on the other surface of the base substrate 51.

The signal wiring layer 52 has signal conductors. Part of the signal conductors of the signal wiring layer 52 is not covered with a protective film 54, but exposed. There are a plurality of exposed portions 60, and they serve as terminals in the form of stripes. Electronic components 58 are bump-mounted on the signal wiring layer 52, and each of the electronic components 58 is connected electrically to the signal wiring layer 52 via bumps 59 and electrodes 57 provided on the signal wiring layer 52.

As shown in FIG. 6B, the shielding layer 53 is a metal layer that is formed over the entire surface on the other side of the base substrate 51 (see Patent Document 2). The shielding layer 53 is connected to the GND conductors of the signal wiring layer 52 via through holes 56. Moreover, the shielding layer 53 is covered with a protective film 55, while a portion of the shielding layer 53 remains exposed.

The connector 61 includes a terminal member 62 connected to the signal wiring layer 52, a terminal member 63 connected to the shielding layer 53, and a housing 64 for supporting the terminal members 62, 63. The connector 61 is formed so that the end of the FPC board 50 is fastened between the terminal members 62, 63. Moreover, the terminal member 63 is connected to a ground potential to suppress noise caused by the shielding layer.

In the connection structure of FIGS. 5A and 5B, the through holes are formed in the FPC board to improve the packaging density. Therefore, the wiring structure of the FPC board becomes complicated, and the manufacturing cost is high. Moreover, there is a limit to enlargement of the mounting area because of the formation of the through holes.

In the connection structure of FIGS. 6A and 6B, the shielding layer needs to be formed over the entire surface on one side of the FPC board. Therefore, the packaging density cannot be improved.

SUMMARY OF THE INVENTION

In order to overcome the problems described above, preferred embodiments of the present invention provide a circuit board that can improve the packaging density while suppressing an increase in the manufacturing cost, a connection structure using the circuit board, and an apparatus having the connection structure.

A circuit board according to a preferred embodiment of the present invention is connected to a connector that includes a connection port for receiving an object to be connected and a plurality of contact portions located at upper and lower positions of the connection port. Any of the contact portions at one of the upper and lower positions and any of the contact portions at the other position face each other in a vertical direction, and each contact portion is connected electrically to the opposite contact portion. The circuit board includes a base substrate, a first wiring layer formed on one principal surface of the base substrate, and a second wiring layer formed on the other principal surface of the base substrate. First terminals connected to the first wiring layer are provided on the one principal surface, and second terminals connected to the second wiring layer are provided on the other principal surface. The first terminals and the second terminals come into contact with any of the contact portions and are arranged so as not to overlap each other in the vertical direction.

A connection structure according to a preferred embodiment of the present invention includes a connector and a circuit board. The connector and the circuit board are connected to form the connection structure. The connector includes a connection port for receiving the circuit board and a plurality of contact portions located at upper and lower positions of the connection port. Any of the contact portions at one of the upper and lower positions and any of the contact portions at the other position face each other in a vertical direction, and each contact portion is connected electrically to the opposite contact portion. The circuit board includes a base substrate, a first wiring layer formed on one principal surface of the base substrate, and a second wiring layer formed on the other principal surface of the base substrate. First terminals connected to the first wiring layer are provided on the one principal surface, and second terminals connected to the second wiring layer are provided on the other principal surface. The first terminals and the second terminals come into contact with any of the contact portions and are arranged so as not to overlap each other in the vertical direction.

An apparatus according to another preferred embodiment of the present invention includes the connection structure of the present invention.

As described above, the circuit board of the present invention is connected to the dual contact connector including a plurality of upper and lower contact portions that face each other in the vertical direction. Moreover, the wiring layers and the terminals that come into contact with the contact portions of the connector are provided on both surfaces of the circuit board. Therefore, the circuit board, the connection structure using the circuit board, and the apparatus having the connection structure according to preferred embodiments of the present invention can reduce the number of through holes compared to the conventional techniques, thus suppressing an increase in the manufacturing cost and improving the packaging density of the electronic components.

Other features, elements, steps, processes, characteristics and advantages of the present invention will become more apparent from the following detailed description of preferred embodiments of the present invention with reference to the attached drawings.

BRIEF DESCRIPTION OF THE DRAWINGS

FIGS. 1A and 1B are a cross-sectional view showing a circuit board and a connection structure according to a preferred embodiment of the present invention, wherein FIG. 1A is a cross-sectional view of the connection structure, and FIG. 1B is a cross-sectional view of the circuit board taken along the line A-A' in FIG. 1A.

FIGS. 5A and 5B are cross-sectional views showing an example of a FPC board and a connection structure in a conventional technique, wherein FIG. 5A is a cross-sectional view of the connection structure, and FIG. 5B is a cross-sectional view of the FPC board taken along the line B-B' in FIG. 5A.

FIGS. 6A and 6B are a cross-sectional view showing another example of a FPC board and a connection structure in a conventional technique, wherein FIG. 6A is a cross-sectional view of the connection structure, and FIG. 6B is a cross-sectional view of the FPC board taken along the line C-C' in FIG. 6A.

DETAILED DESCRIPTION OF PREFERRED EMBODIMENTS

Figure 1A:
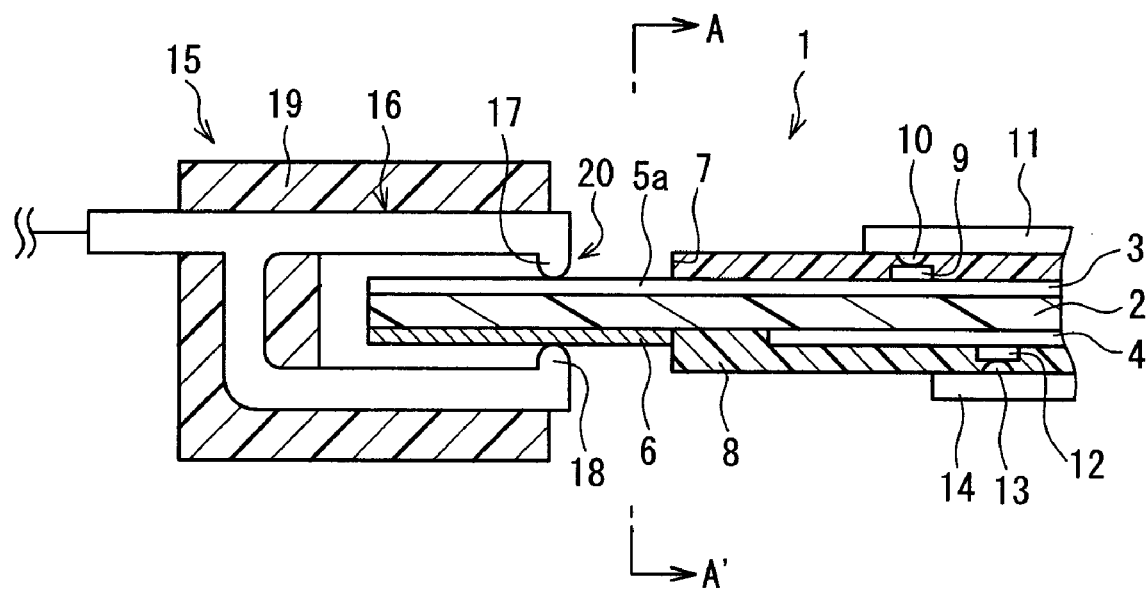

A circuit board according to a preferred embodiment of the present invention is connected to a connector that includes a connection port for receiving an object to be connected and a plurality of contact portions located at upper and lower positions of the connection port. Any of the contact portions at one of the upper and lower positions and any of the contact portions at the other position face each other in a vertical direction, and each contact portion is connected electrically to the opposite contact portion. The circuit board includes a base substrate, a first wiring layer formed on one principal surface of the base substrate, and a second wiring layer formed on the other principal surface of the base substrate. First terminals connected to the first wiring layer are provided on the one principal surface, and second terminals connected to the second wiring layer are provided on the other principal surface. The first terminals and the second terminals come into contact with any of the contact portions and are arranged so as not to overlap each other in the vertical direction.

A connection structure according to a preferred embodiment of the present invention includes a connector and a circuit board. The connector and the circuit board are connected to form the connection structure. The connector includes a connection port for receiving the circuit board and a plurality of contact portions located at upper and lower positions of the connection port. Any of the contact portions at one of the upper and lower positions and any of the contact portions at the other position face each other in a vertical direction, and each contact portion is connected electrically to the opposite contact portion. The circuit board includes a base substrate, a first wiring layer formed on one principal surface of the base substrate, and a second wiring layer formed on the other principal surface of the base substrate. First terminals connected to the first wiring layer are provided on the one principal surface, and second terminals connected to the second wiring layer are provided on the other principal surface. The first terminals and the second terminals come into contact with any of the contact portions and are arranged so as not to overlap each other in the vertical direction.

In the circuit board and the connection structure according to a preferred embodiment of the present invention, it is preferable that dummy terminals that are insulated electrically from the first wiring layer and the second wiring layer are provided on both principal surfaces of the base substrate, and the dummy terminals are located in a region that is on the opposite side of the base substrate to a region where the first terminals or the second terminals are provided. With this configuration, the thicknesses of portions of the circuit board that come into contact with the connector can be uniform, and the connection between the circuit board and the connector can be stabilized.

The circuit board and the connection structure according to various preferred embodiments of the present invention are useful when the base substrate has flexibility, and the circuit board is a flexible printed circuit board. In the circuit board and the connection structure according to various preferred embodiments of the present invention, electronic components may be mounted on the one principal surface so as to be connected electrically to the first wiring layer, and different electronic components from those electronic components may be mounted on the other principal surface so as to be connected electrically to the second wiring layer.

According to another preferred embodiment, an apparatus of the present invention includes the connection structure of the present preferred embodiment of the present invention.

Hereinafter, a circuit board, a connection structure, and an apparatus according to a preferred embodiment of the present invention will be described with reference to FIGS. 1A to 4.

Figure 1B:
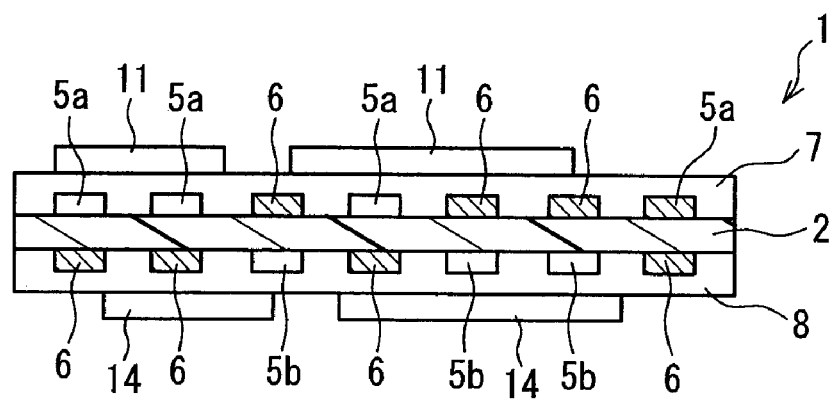
Figure 2:
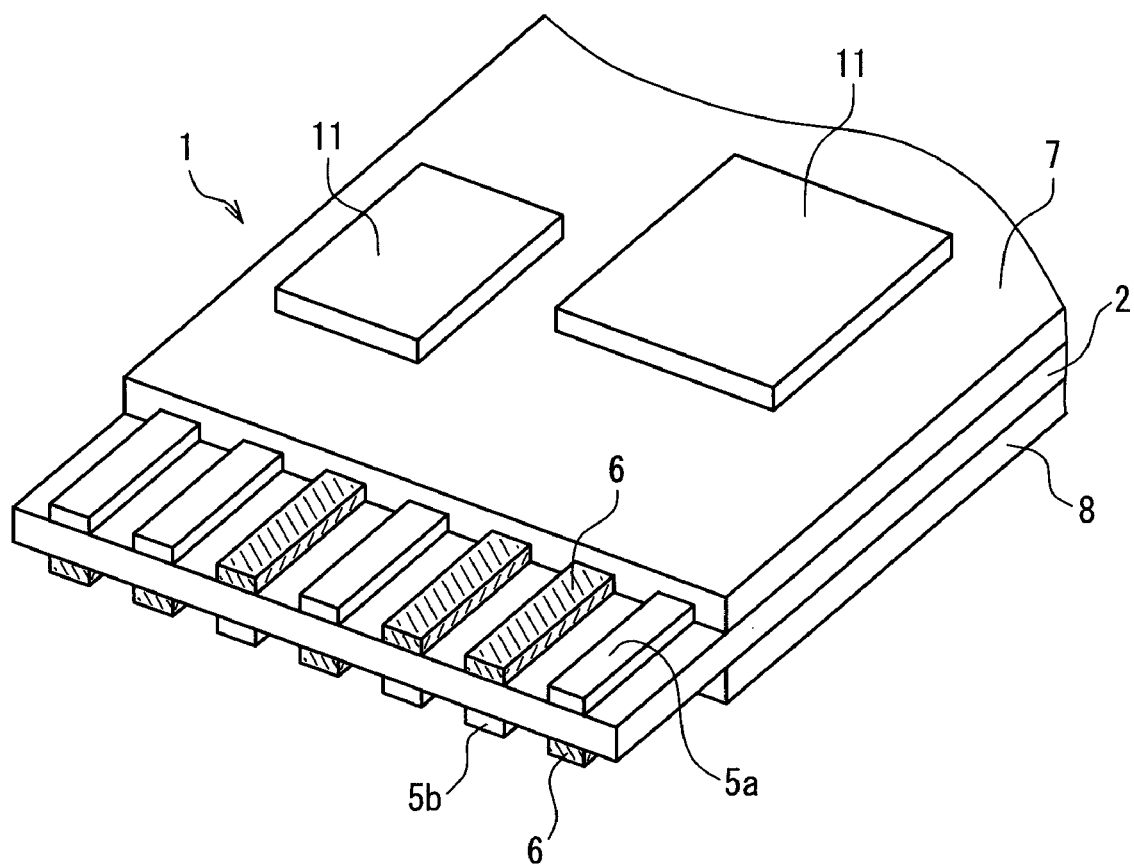
FIG. 2 is a perspective view showing the appearance of the circuit board in FIGS. 1A and 1B.
Figure 3:
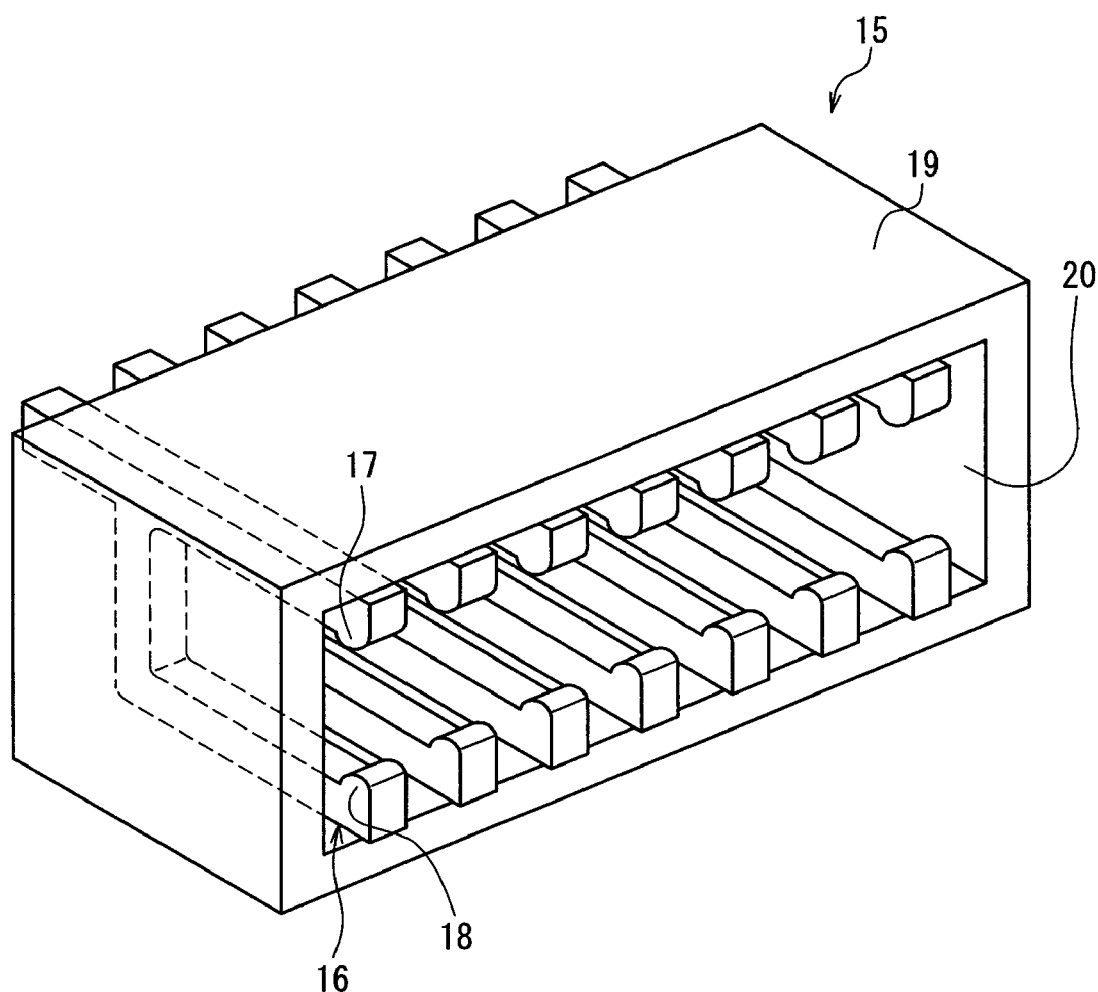
FIG. 3 is a perspective view showing the appearance of a connector that constitutes the connection structure in FIGS. 1A and 1B.

First, the circuit board and the connection structure of this embodiment will be described by referring to FIGS. 1A to 3. FIGS. 1A and 1B are cross-sectional views showing the circuit board and the connection structure of this preferred embodiment. FIG. 1A is a cross-sectional view of the connection structure. FIG. 1B is a cross-sectional view of the circuit board taken along the line A-A' in FIG. 1A. FIG. 2 is a perspective view showing the appearance of the circuit board in FIG. 1. FIG. 3 is a perspective view showing the appearance of a connector that constitutes the connection structure in FIG. 1. In FIGS. 1A and 1B, the cross section of a conductive member (except for a dummy terminal 6) is not hatched, and electronic components are shown only in outline.

As shown in FIG. 1A, the connection structure includes a circuit board 1 and a connector 15 and is formed by connecting the circuit board 1 to the connector 15. In this case, the connector 15 is a dual contact connector, which is similar to the connector 40 in FIG. 5 as described in Background Art.

As shown in FIGS. 1A and 3, the connector 15 includes a connection port 20 into which the circuit board 1 (i.e., an object to be connected) is inserted, a plurality of contact portions 17 located at the upper position of the connection port 20, and a plurality of contact portions 18 located at the lower position of the connection port 20. The contact portions 17 face any of the contact portions 18 in the vertical direction and are connected electrically to the opposite contact portions 18.

In the context of the present invention, the vertical direction indicates a direction that is the same as the thickness direction of the circuit board 1 when it is inserted into the connection port 20 of the connector 15. The upper position of the connection port 20 indicates the side facing the upper surface of the circuit board 1 when it is inserted into the connection port 20. The lower position of the connection port 20 indicates the side facing the lower surface of the circuit board 1 when it is inserted into the connection port 20.

In this preferred embodiment, the connector 15 includes a plurality of terminal members 16 made of a conductive material and a housing 19 made of a resin material. Each of the terminal members 16 preferably has a substantially U-shaped portion, and one end of the substantially U-shaped portion is the contact portion 17 and the other end of the substantially U-shaped portion is the contact portion 18.

As shown in FIG. 3, the terminal members 16 are arranged by the housing 19 along the direction that is substantially perpendicular to the insertion direction of the circuit board 1 so that the contact portions 17 are located opposite the respective contact portions 18 in the vertical direction. Therefore, the contact portions 17, 18 facing each other in the vertical direction are connected electrically. Moreover, the contact portions 17, 18 are aligned respectively in a line along the direction that is substantially perpendicular to the insertion direction of the circuit board 1.

As shown in FIGS. 1B and 2, the circuit board 1 includes a base substrate 2, a first wiring layer 3 formed on one principal surface of the base substrate 2, and a second wiring layer 4 formed on the other principal surface of the base substrate 2.

In this preferred embodiment, the first wiring layer 3 and the second wiring layer 4 have signal conductors, respectively. The first wiring layer 3 and the second wiring layer 4 are not a shielding layer. The circuit board 1 is a FPC board, and the base substrate 2 is made of a resin film with flexibility such as a polyester film, polyamide film, or polyimide film. Reference numeral 7, 8 denote a protective film made of a resin material. In preferred embodiments of the present invention, the circuit board may be a rigid board.

As shown in FIGS. 1B and 2, a plurality of first terminals 5a in the form of stripes are provided on the principal surface on which the first wiring layer 3 is formed. Also, a plurality of second terminals 5b in the form of stripes are provided on the principal surface on which the second wiring layer 4 is formed. Moreover, the first terminals 5a and the second terminals 5b are arranged so as to come into contact with any of the contact portions 17, 18 of the connector 15.

In this preferred embodiment, the protective film 7 is formed not to cover a portion of the first wiring layer 3, and the portion that is not covered with the protective film 7 corresponds to the first terminal 5a. Similarly, the protective film 8 is formed not to cover a portion of the second wiring layer 4, and the portion that is not covered with the protective film 8 corresponds to the second terminal 5b.

The first terminals 5a and the second terminals 5b are arranged so as to come into contact with any of the contact portions 17, 18 of the connector 15. Moreover, as shown in FIGS. 1B and 2, the first terminals 5a and the second terminals 5b do not overlap in the vertical direction. In this preferred embodiment, a plurality of dummy terminals 6 are provided in a region that is on the opposite side of the base substrate 2 to a region where the first terminals 5a or the second terminals 5b are arranged. The dummy terminals 6 are arranged so as to overlap the first terminals 5a or the second terminals 5b in the vertical direction. In FIGS. 1 and 2, the dummy terminals 6 are hatched.

As shown in FIG. 1A, the dummy terminals 6 provided on the same side as the second wiring layer 4 are insulated electrically from the second wiring layer 4. Similarly, although not shown in the drawing, the dummy terminals 6 provided on the same side as the first wiring layer 3 also are insulated electrically from the first wiring layer 3.

In the circuit board 1, only one of a pair of terminals having a positional relationship such that the two terminals overlap each other in the vertical direction can transmit a signal. Therefore, it is possible to prevent the first and second terminals 5a, 5b capable of transmitting a signal from being connected electrically to the same terminal member 16, and thus the occurrence of a connection failure caused by this also can be suppressed.

In this preferred embodiment, since the dummy terminals 6 are used, the thicknesses of portions of the circuit board 1 that come into contact with the terminal members 16 (i.e., the contact portions 17, 18) can be uniform due to the presence of the dummy terminals 6. Thus, the connection between the circuit board 1 and the connector 15 can be stabilized. However, the present invention may be applied to an embodiment that does not use the dummy terminals 6. In this case, it is also possible to prevent the first and second terminals 5a, 5b from being connected electrically to the same terminal member 16.

Figure 5A:
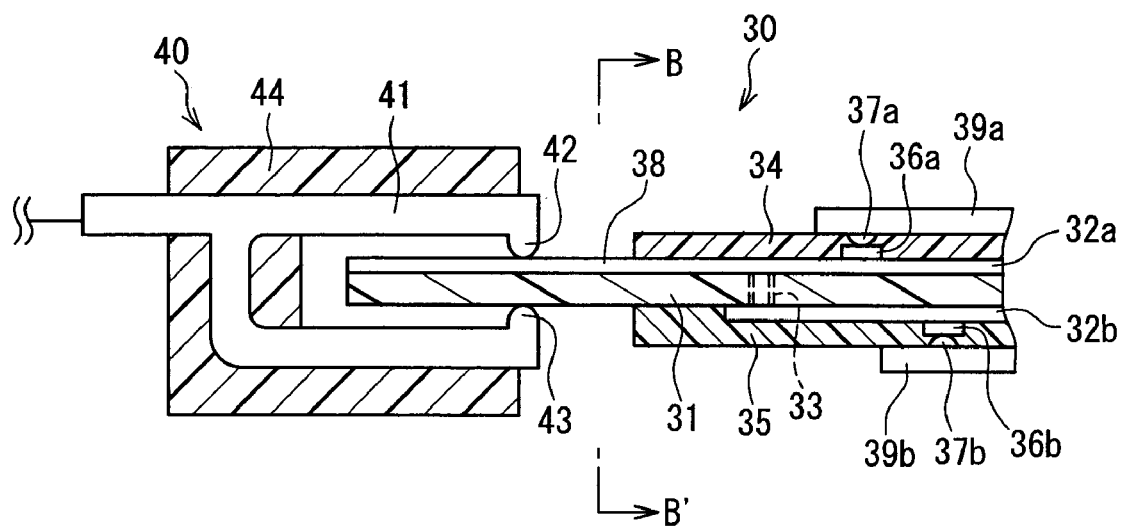
Figure 5B:
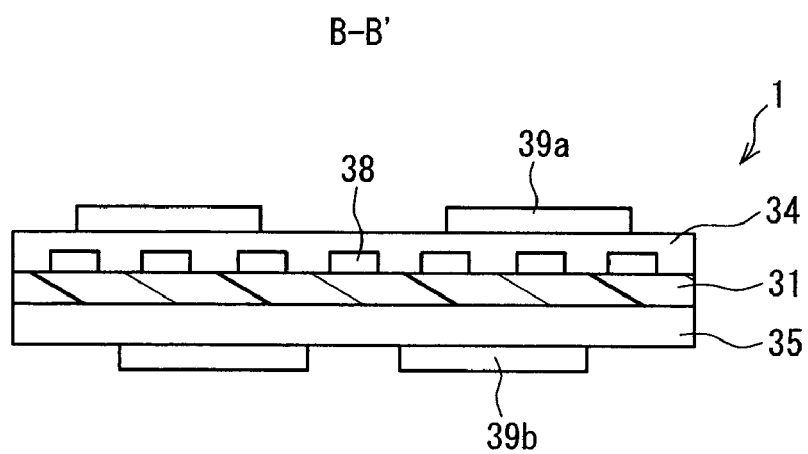
Figure 6A:
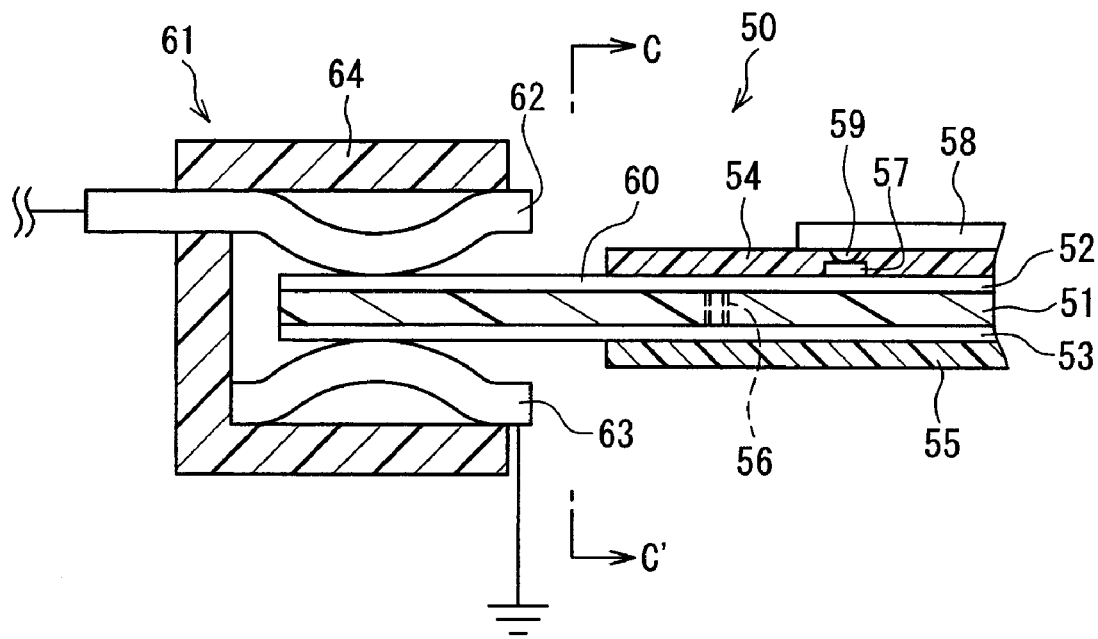
Figure 6B:
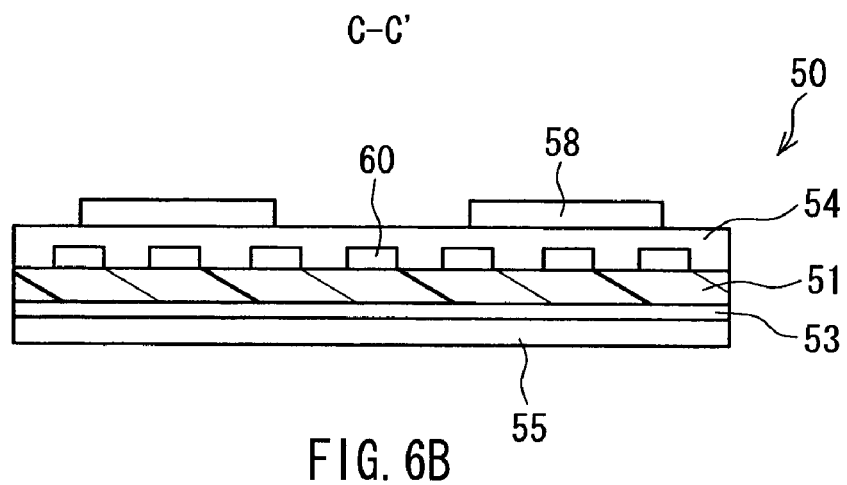

In this preferred embodiment, since the terminals 5a, 5b are provided on both surfaces of the base substrate 2, the electronic components can be mounted on both surfaces of the base substrate 2 even without forming the through holes in FIG. 5 as described in Background Art. Therefore, this preferred embodiment can reduce the number of through holes that should be formed in the circuit board 1, thus suppressing an increase in the manufacturing cost of the circuit board and improving the packaging density. Moreover, the area of the circuit board can be decreased.

As shown in FIGS. 1 and 2, electronic components 11 are mounted on the same side of the base substrate 2 as the first wiring layer 3, and electronic components 14 are mounted on the same side of the base substrate 2 as the second wiring layer 4. The electronic components 11, 14 are bump-mounted. Each of the electronic components 11 is connected electrically to the first wiring layer 3 via bumps 10 and electrodes 9 provided on the first wiring layer 3. Similarly, each of the electronic components 14 is connected electrically to the second wiring layer 4 via bumps 13 and electrodes 12 provided on the second wiring layer 4.

The mounting method of the electronic components 11, 14 on the circuit board 1 is not limited to the bump mounting as shown in FIG. 1. In addition, the electronic components 11, 14 may be mounted by wire bonding or the like. Examples of the electronic components 11, 14 include a bare chip.

Next, the apparatus of this preferred embodiment will be described by referring to FIG. 4. The type or use of the apparatus of this preferred embodiment is not particularly limited as long as it may have the connection structure in FIG. 1. Examples of the apparatus of this preferred embodiment include a flat panel display typified by a liquid crystal display, a digital camera, a video camera, a portable telephone, a personal computer, game equipment, a memory (a hard disk, optical recording apparatus, etc.), a printer, a car navigation system, and a car audio system.

Figure 4:
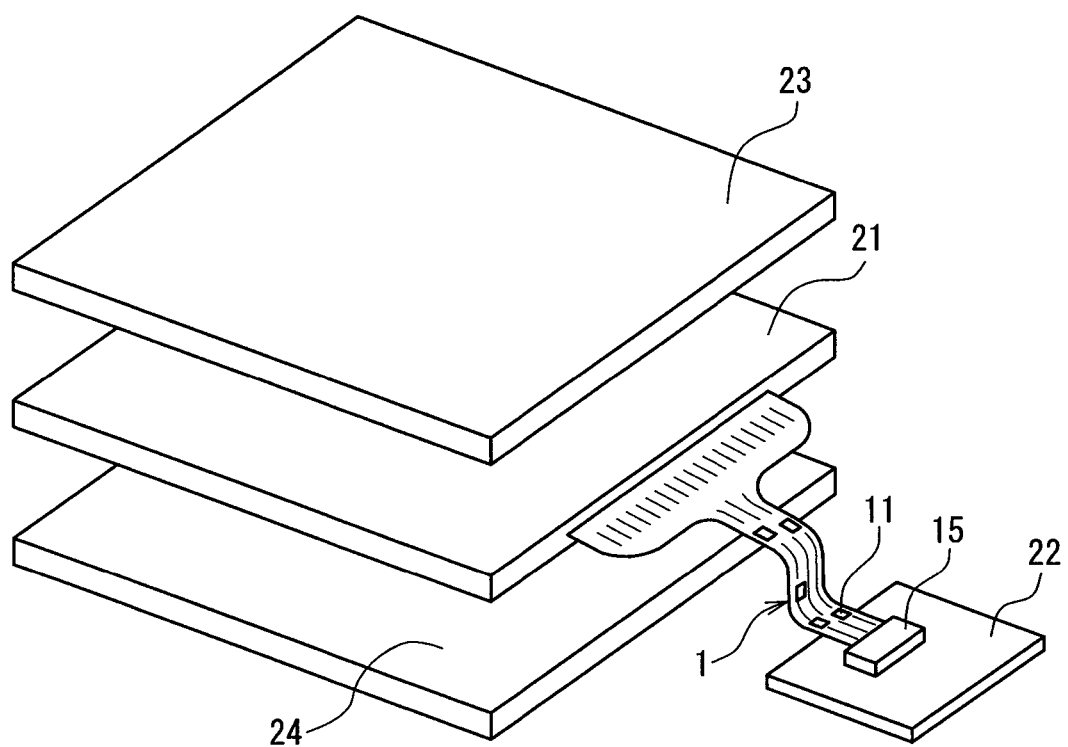
FIG. 4 shows a schematic configuration of an apparatus in a preferred embodiment of the present invention.

FIG. 4 shows a schematic configuration of the apparatus of this preferred embodiment. In the example of FIG. 4, the apparatus is a liquid crystal display. As shown in FIG. 4, one end of the circuit board 1 is connected directly to a liquid crystal display panel 21, while the other end of the circuit board 1 is connected to the connector 15 mounted on a circuit board 22, thereby forming the connection structure in FIG. 1.

An optical film 23 or 24 such as a deflection film is stuck to both surfaces of the liquid crystal display panel 21. Moreover, although not shown in the drawing, a backlight device, a frame, or various circuit boards are attached, resulting in a liquid crystal display.

As described above, the circuit board of the present invention can prevent an increase in the manufacturing cost. Therefore, even in the connection structure or the apparatus having the connection structure, an increase in the manufacturing cost also can be prevented. Moreover, the circuit board of the present invention can improve the packaging density and reduce the substrate area, so that the connection structure or the apparatus having the connection structure can be made smaller and thinner.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A circuit board connected to a connector, the connector comprising a connection port arranged to receive an object to be connected and a plurality of contact portions located at upper and lower positions of the connection port, wherein any of the contact portions at one of the upper and lower positions and any of the contact portions at the other position face each other in a vertical direction, and each contact portion is connected electrically to the opposite contact portion, the circuit board comprising:

a base substrate;

a first wiring layer located on a first principal surface of the base substrate; and a second wiring layer located on a second principal surface of the base substrate; wherein first terminals connected to the first wiring layer are provided on the first principal surface, and second terminals connected to the second wiring layer are provided on the second principal surface, and the first terminals and the second terminals come into contact with any of the contact portions and are arranged so as not to overlap each other in the vertical direction.

2. The circuit board according to claim 1, wherein dummy terminals that are insulated electrically from the first wiring layer and the second wiring layer are provided on both principal surfaces of the base substrate, and the dummy terminals are located in a region that is on the opposite side of the base substrate relative to a region where the first terminals or the second terminals are provided.

3. The circuit board according to claim 1, wherein the base substrate is flexible, and the circuit board is a flexible printed circuit board.

4. The circuit board according to claim 1, wherein electronic components are mounted on the first principal surface so as to be connected electrically to the first wiring layer, and different electronic components from those electronic components are mounted on the second principal surface so as to be connected electrically to the second wiring layer.

5. A connection structure comprising:

a connector; and a circuit board, the connector and the circuit board being connected to define the connection structure; wherein the connector includes a connection port arranged to receive the circuit board and a plurality of contact portions located at upper and lower positions of the connection port;

any of the contact portions at one of the upper and lower positions and any of the contact portions at the other position face each other in a vertical direction;

each contact portion is connected electrically to the opposite contact portion;

the circuit board includes a base substrate, a first wiring layer located on a first principal surface of the base substrate, and a second wiring layer located on a second principal surface of the base substrate;

first terminals connected to the first wiring layer are provided on the first principal surface, and second terminals connected to the second wiring layer are provided on the second principal surface, and the first terminals and the second terminals come into contact with any of the contact portions and are arranged so as not to overlap each other in the vertical direction.

6. The connection structure according to claim 5, wherein dummy terminals that are insulated electrically from the first wiring layer and the second wiring layer are provided on both principal surfaces of the base substrate, and the dummy terminals are located in a region that is on the opposite side of the base substrate relative to a region where the first terminals or the second terminals are provided.

7. The connection structure according to claim 5, wherein the base substrate is flexible, and the circuit board is a flexible printed circuit board.

8. The connection structure according to claim 5, wherein electronic components are mounted on the first principal surface so as to be connected electrically to the first wiring layer, and different electronic components from those electronic components are mounted on the second principal surface so as to be connected electrically to the second wiring layer.

9. An apparatus comprising the connection structure according to claim 5.

* * * * *